United States Patent [19]
Bales

[11] Patent Number: 6,114,874
[45] Date of Patent: Sep. 5, 2000

[54] COMPLEMENTARY MOS LEVEL TRANSLATING APPARATUS AND METHOD

[75] Inventor: James E. Bales, Fort Collins, Colo.

[73] Assignee: National Semiconductor Corporation, Santa Clara, Calif.

[21] Appl. No.: 09/075,572

[22] Filed: May 11, 1998

[51] Int. Cl.$^7$ .............................................. H03K 19/0175
[52] U.S. Cl. ................................ 326/66; 326/66; 307/475
[58] Field of Search ................................ 326/63, 64, 66, 326/67, 68, 73, 74, 83, 84, 85, 109, 110

[56] References Cited

U.S. PATENT DOCUMENTS

| | | | |
|---|---|---|---|
| 4,992,681 | 2/1991 | Urakawa et al. ........................ | 307/475 |
| 5,304,869 | 4/1994 | Greason .................... | 307/446 |
| 5,459,412 | 10/1995 | Mentzer ..................................... | 326/66 |
| 5,502,405 | 3/1996 | Williams .................................... | 326/66 |

OTHER PUBLICATIONS

Analysis and Optimization of BiCMOS Digital Circuit Structures; S.H.K. Embabi, A. Bellaouar, and, M.I. Elmasry; IEEE Journal of Solid State Circuits, vol. 26, No. 4, Apr., 1991; pp. 676–679.

A 7–ns 1–Mb BiCMOS ECL SRAM with Shift Redundacy; Atsushi Ohba, Shigeki Ohbayashi, Toru Shiomi, Satoshi Takano, Kenji Anami, Member IEEE, Hiroki Honda, Yoshiyuki Ishigaki, Masahiro Hatanaka, Shigeo Nagao, and Shimpei Kayano; IEEE Journal of Solid–State Circuits, vol. 26, No. 4, Apr., 1991; pp. 507–512.

*Primary Examiner*—Michael Tokar
*Assistant Examiner*—Thanh-Tom Le
*Attorney, Agent, or Firm*—Limbach & Limbach L.L.P.

[57] ABSTRACT

A level translating circuit suitable for converting ECL level signals to CMOS level signals. The ECL signal is converted to a pair of buffered differential signals that are level shifted and divided to produce four transistor drive signal, two of which are connected to the respective gate and source of a P-type MOS transistor and two of which are connected to the respective gate and source of another P-type MOS transistor. An N-type transistor is connected in series with each of the P-type transistors so as to provide CMOS outputs at the junction of the N and P-type transistors.

39 Claims, 3 Drawing Sheets

COMPLEMENTARY MOS LEVEL TRANSLATING APPARATUS AND METHOD

BACKGROUND OF THE INVENTION

1. Field of the Invention

The present invention relates generally to translation circuits and, in particular, to circuits suitable for translating Current Mode Logic (CML) level signals to Complementary Metal Oxide Semiconductor (CMOS) level signals.

2. Description of Related Art

In digital systems using logic circuitry from different types of logic families, it is necessary to translate one logic level to another. By way of example, logic levels used in Current Mode Logic (CML) circuits, such as Emitter Coupled Logic (ECL), frequently have to be translated to logic levels used in Complementary Metal Oxide Semiconductor (CMOS) circuits. ECL is typically utilizes when high speed is desired and where relatively high power consumption can be tolerated. CMOS is typically used where speed is not of paramount concern, but low power consumption is needed. ECL is implemented using bipolar transistors and CMOS is implemented using MOS transistors. When it is necessary to provide an interface between the two types of circuit families, it is common to use BiCMOS technology which combines both bipolar and MOS transistors. Note that the term MOS is used herein to include all types of insulated gate field effect transistors including both metal and silicon gate devices.

Referring to the drawings, FIG. 1 is a schematic diagram of a conventional ECL to CMOS converter circuit using BiCMOS technology. The input Vin is produced by ECL circuitry and typically has a small voltage swing of only 0.8 volts. Although ECL is frequently powered from negative supplies, the exemplary circuit of FIG. 1 uses a +5 volt supply. CMOS voltage swings are typically from rail to rail so that there will be a 5 volt swing when a single +5 volt supply is used.

The FIG. 1 circuit includes an ECL buffer circuit which includes differentially-connected NPN transistor 10 and 12 having their emitters connected to a common current source 14A. The ECL input Vin is buffered by a pair of emitter-follower stages including transistor 20 in combination with current source 14B followed by transistor 22 in combination with current source 14C. Thus, the voltage applied to the input of the differential amplifier, the base of transistor 10, will still have a voltage swing of 0.8 volts since the emitter follower stages each have unity voltage gain. The remaining input to the differential amplifier, the base of transistor 12, is connected to a reference voltage Vref. Vref is selected such that the voltage falls at the center of the voltage swing present at the base of transistor 10, that being equal to the center of the swing.

When Vin is at the maximum value, transistor 10 is turned on and transistor 12 is off. Thus, all current provided by source 14A will flow through load resistor 16. The magnitude of current source 14A and resistor 16 (also resistor 18) are selected such that the voltage at the collector of transistor 10 will not drop sufficiently low to permit transistor 10 to go into saturation thereby assuring high speed operation. At no time should the transistor 10 collector voltage (or the transistor 12 collector voltage) be permitted to drop below Vref. Since transistor 12 is off, the collector of the transistor will be almost at voltage $V_{DD}$. When Vin is at a minimum value, transistor 10 is turned off so that all current from source 14A will flow through resistor 18. Thus, the differential output of the differential stage, the collectors of transistors 10 and 12, will have a voltage swing that is still fairly small with respect to $V_{DD}$ and will be roughly 2.0 volts.

The differential outputs of the buffer stage are each connected to respective inputs of a pair of emitter-follower circuits including transistor 24 operating in combination with current source 14D and transistor 26 operating in combination with current source 14E. The follower outputs are connected to the respective gates of P-type MOS transistors 28 and 30. The drain of transistor 28 is connected to the input half of a current mirror circuit, namely, the gate and drain of an N-type transistor 32. The drain of transistor 30 is connected to the drain of transistor 34 which forms the output half of the current mirror circuit.

When the input to the gate of transistor 28 drops and the input to the gate of transistor 30 is raised, transistor 28 is turned on and transistor 30 is turned off. Current flow in transistor 28 causes flow in transistor 34, with this current being mirrored into transistor 34. Since transistor 30 is off, the drain of transistor 34, the output of the circuit, will be pulled down to ground potential. Similarly, if the inputs cause transistor 28 to turn off and transistor 30 to turn on, current through 32 will stop. This lack of current will be reflected in the current mirror so that transistor 34 will turn off. This combination will cause the drain of transistor 30, the circuit output, to approach the supply voltage $V_{DD}$. Thus, the output is CMOS compatible.

FIG. 2 is another exemplary ECL to CMOS converter circuit using BiCMOS technology. In this case. the ECL input happens to be a differential input Vin and $\overline{\text{Vin}}$. The ECL input maximum value will typically be on the order of one diode drop (0.7 volts) below $V_{DD}$. An NPN transistor 36, P-type MOS transistor 35 and current source 39 form a biasing circuit 37. The base of transistor 36 is connected to a bias voltage $V_B$ which is typically set to be near the high point of the voltage swing of Vin and $\overline{\text{Vin}}$. Transistor 35 will thus conduct the current drawn by source 39 and operate to bias the gates of N-type MOS transistors 40A, 40B, 40C and 40D at a fixed voltage notwithstanding changes in the supply voltage $V_{DD}$.

Input Vin is connected to bases of bipolar transistors 38A and 38B and complementary input $\overline{\text{Vin}}$ is connected to the bases of transistors 38C and 38D so as to form four emitter follower circuits. The outputs of the emitter followers are connected to the respective sources of transistors 40A, 40B, 40C and 40D. The drain of transistor 40A is connected to the input half of a first current mirror, namely the drain and gate of N-type transistor 42. Similarly, the drain of transistor 40D is connected to the input half of a second current mirror, namely the drain and gate of N-type transistor 42D.

The drain of transistor 40C is connected to the first current mirror output, the drain of N-type transistor 42A. The drain of transistor 40B is connected to the second current mirror output, the drain of N-type transistor 42C. The drain of transistor 42C also functions as the output Vout of the circuit, with the drain of transistor 42B functioning as the inverted output $\overline{\text{Vout}}$.

When Vin is at a maximum value, the source voltage of transistors 40A and 40B are increased. At the same time $\overline{\text{Vin}}$ will be at a minimum value so that the transistor 40C and 40D source voltages will be at a minimum value. The gate voltages of the four P-type transistors will be held at a constant voltage by biasing circuit 37, midway between the increased source voltage of transistors 40A and 40B and the decreased source voltage of transistors 40C and 40D. Under these conditions, transistors 40A and 40B will be on and transistors 40C and 40D will be off.

Transistor 40A will conduct a current which will be mirrored by transistor 42A into transistor 42B thereby causing transistor 42B to be conductive. At the same time, transistor 40C will be off, so that the drain of transistor 42B, the inverted output $\overline{\text{Vout}}$, will be pulled down to ground potential ($V_{SS}$). Transistor 40D will be off so that the current input to the second mirror will be zero thereby causing mirror output transistor 42C to be off. Since transistor 40B is on, the circuit output Vout will be pulled to a high voltage approaching Vin less the base-emitter voltage $V_{BE}$ of transistor 38B. When Vin and $\overline{\text{Vin}}$ change state, transistors 40A and 40B will turn off and transistors 40C and 40D will turn on thereby causing the second current mirror to become active so that Vout will be at ground potential and $\overline{\text{Vout}}$ will be pulled up to a high voltage by transistor 40C approaching $\overline{\text{Vin}}$ minus the base-emitter voltage $V_{BE}$ of transistor 38C.

A principal disadvantage of the FIG. 1 and FIG. 2 prior art translating circuits is the relatively small magnitude of the drive voltage to the P-type transistors. In the FIG. 1 circuit, for example, the source voltage is fixed at $V_{DD}$ and the gate drive voltages applied to transistors 28 and 30 only change a small amount roughly equal to the difference in voltage between $V_{DD}$ and Vref. In the FIG. 2 circuit, the gates of the P-type transistors 40A, 40B, 40C and 40D are held constant, with the source drive voltage swing being equal to the relatively small change in input voltage Vin (or $\overline{\text{Vin}}$).

The relatively small P-type transistor drive voltage of the prior art circuits results in reduced operating speed. This reduction in speed can be offset by increasing the magnitude of current used in the circuits but this results in undesirable increased power consumption. Further, an additional voltage gain stage could be added to increase speed, but this would also increase power consumption and increase circuit complexity.

There is a need for a translator circuit capable of achieving relatively high speed operation without incurring undue power consumption. The present invention provides this advantage along with additional advantages that will become apparent to those skilled in the art upon a reading of the following Detailed Description of the Invention together with the drawings.

SUMMARY OF THE INVENTION

A level translating circuit and method for converting digital signals at one level, such as ECL signals, to digital signals at another level, such as CMOS signals, are disclosed. In the event the input signal is a single ended signal, the translating circuit includes a buffer circuit which produces first and second differential signals connected to transistor drive circuitry. The transistor drive circuitry is configured to produce first, second, third and fourth drive signals, each of which switches between different levels in response to changes in the first and second differential signals.

The level translating circuit further includes a translator stage which includes four transistors, including first and second transistors of a first conductivity type, typically P-type. The source and gate of the first transistor are connected to receive the first and second drive signals, respectively, and the source and gate of the second transistor are connected to receive the third and fourth drive signals, respectively. The second and third transistors, typically N-type transistors, are connected in series with the first and second transistors, respectively. The output of the translating circuit is produced at a point in the translator stage intermediate the first and second transistor, typically at a common drain connection.

DETAILED DESCRIPTION OF THE INVENTION

Figure 3:
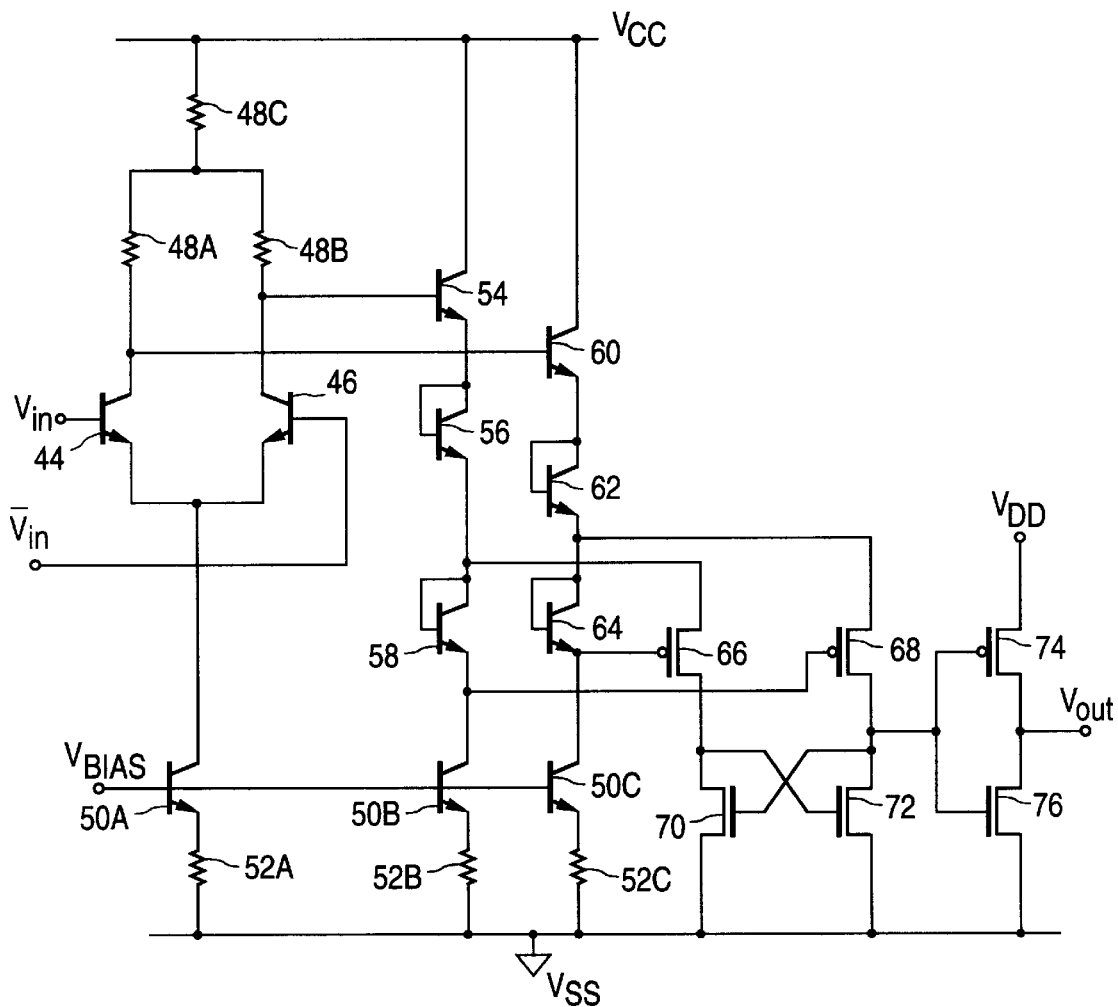
FIG. 3 is a schematic diagram of a level translating circuit in accordance with one embodiment of the invention.

Referring again to the drawings, FIG. 3 depicts a BiCMOS translator circuit in accordance with the present invention which converts ECL level signals to CMOS signals. As is frequently the case with BiCMOS circuits, two power supplies are used, including a supply $V_{CC}$ which provides +5 volts and supply $V_{DD}$ which provides +3.3 volts.

Figure 1:
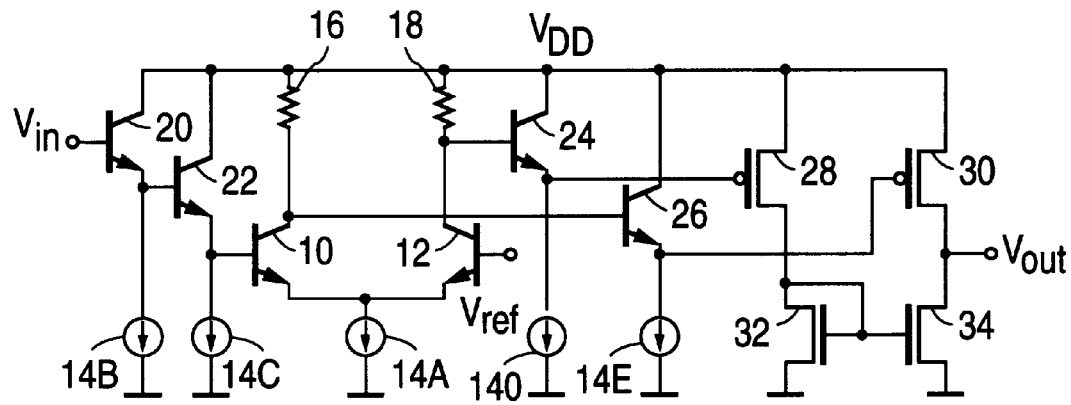
FIG. 1 is a schematic diagram of one embodiment of a conventional ECL to CMOS converter circuit.
Figure 2:
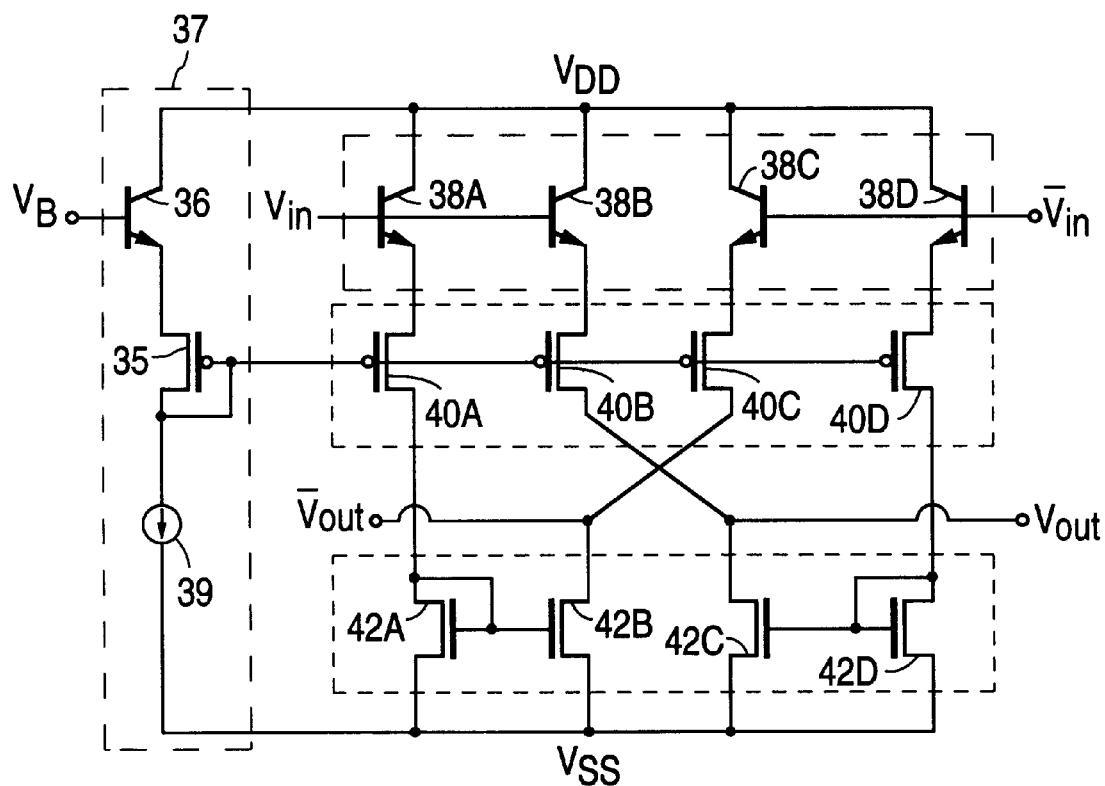
FIG. 2 is a schematic diagram of another embodiment of a conventional ECL to CMOS converter circuit.

The FIG. 3 circuit includes an ECL buffer stage having NPN transistor pair 44 and 46 connected as a differential amplifier. Resistors 48A and 48B are collector load resistors connected to supply $V_{CC}$ by way of a common resistor 48C. Although not shown in FIG. 3, the ECL signals are typically buffered by a pair of emitter-follower circuits, such shown in FIG. 1 (transistors 20 and 22), so that ECL levels will be shifted by two base-to-emitter voltages (+1.2 volts). Thus, the differential inputs $\overline{\text{Vin}}$ and $\overline{\text{Vin}}$ will swing between about +3.0 volts and +2.2 volts for a +5 volts $V_{CC}$ supply. If the input were single ended, then the base of transistor 46 could be set to a reference voltage half way between the input Vin swing, namely +2.6 volts.

The FIG. 3 circuit includes three current sources formed from transistors 50A, 50B and 50C. All three transistor have a base connected to a bias voltage $V_{BIAS}$. The source currents are set by the value of respective resistors 52A, 52B and 52C. The first current source formed from transistor 50A provides current to the differential buffer stage, with the current magnitude, in combination with the values of resistors 48A, 48B and 48C being selected to ensure that neither transistor 44 nor 46 will ever saturate. The differential voltage output swing at the collectors of transistors 44 and 46 will go to a value about 0.5 volts less than $V_{cc}$ (+4.5 volts) due to the drop across resistor 48C and a value about equal to the maximum value of Vin or about +3 volts.

The differential outputs of the buffer stage are forwarded to a pair of identical parallel intermediate stages or segments which perform a transistor drive function. The first stage includes a series connection of an NPN transistor 54, diode-connected transistors 56 and 58 and a current source comprised of NPN transistor 50B and resistor 52B. Transistor 54 is connected as an emitter follower, with its base connected to the collector of transistor 46, one of the buffer stage outputs. Similarly, the second intermediate stage includes emitter follower connected NPN transistor 60, diode connected transistors 62 and 64 and a current source made up of transistor 50C and resistor 52C.

Each of the intermediate stages or segments has two outputs which drive a translator stage which includes transistors 66, 68, 70 and 72 connected in a cross-coupled implementation. One output of the first intermediate stage is connected to the source of P-type transistor 66 and a second connected to the gate of P-type transistor 68. The second intermediate stage has a first output connected to the source of transistor 68 and a second output connected to the gate of transistor 66. Thus, when Vin is high and $\overline{V}$in is low, the base of transistor 60 will drop to about +3 volts and the base of transistor 54 will increase to about +4.5 volts. The base-emitter drops across transistors 54 and 56 will reduce the voltage at the emitter of transistor 56 to +3.3 volts and the drop across transistor 58 will reduce the voltage at the emitter of transistor 58 to +2.7 volts. The base-emitter drops across transistors 60 and 62 will reduce the voltage at the emitter of transistor 62 to 1.8 volts and the drop across transistor 64 will reduce the voltage at the emitter of the transistor to 1.2 volts. When the inputs Vin and $\overline{V}$in change state, the voltages applied to the transistors are reversed due to the symmetry of the circuitry. Table 1 below is a summarization of the gate-source voltages applied to the two P-type transistors 66 and 68 for both input conditions.

TABLE 1

| ECL INPUT | MQS 66 gate-source voltage | MQS 68 gate-source voltage |
| --- | --- | --- |
| Vin = hi | −2.1 V (ON) | +0.9 V (OFF) |
|  | gate − +1.2 V | gate − +2.7 V |
| $\overline{V}$ in = lo | source − +3.3 | source − +1.8 V |
| Vin = lo | +0.9 V (OFF) | −2.1 V (ON) |
|  | gate − +2.7 V | gate − +1.2 V |
| $\overline{V}$ in = hi | source − +1.8 V | source − +3.3 |

Assuming that both transistors 66 and 68 have a threshold voltage of approximately −1 volt, it can be seen from Table 1 that transistor 66 will be turned on hard for Vin high ($\overline{V}$in low) and transistor 68 will be turned off hard, particularly in view of the reversed biased voltage. The converse is true when Vin is low ($\overline{V}$in high).

The drain of transistor 66 is connected to the drain of an N-type transistor 70 and the gate of another N-type transistor 72. Similarly, the drain of transistor 68 is connected to the drain of transistor 72 and the gate of transistor 70. Thus, when transistor 66 is on and transistor 68 is off, the gate of the transistor 72 will be pulled high so that transistor 72 will be on. The output of the translator stage, the drain of transistor 72, will then be at essentially ground potential ($V_{SS}$). When transistor 68 is on and transistor 72 is off, the output of the translator circuit will be pulled up to about +3.3 volts by transistor 68.

The output of the translator stage is connected to a buffer stage also powered by the +3.3 volt power supply $V_{DD}$ which further conditions the translator output. The buffer stage includes P-type transistor 74 and N-type transistor 76 having common gates connected to the translator output and common drains which provide the overall circuit output. Thus, when the translator stage output is high, transistor 74 is off and transistor 76 is on so that the output Vout is at $V_{SS}$. When the translator stage is low ($V_{SS}$), transistor 74 is on and transistor 76 is off so that the output is high ($V_{DD}$).

The FIG. 3 circuit operates at a relatively high speed because of the large drive signals provided to the P-type transistors 66 and 68 as indicated by Table 1 above. This is achieved, in part, by driving both the gate and the source of the two transistors rather than one or the other. These large drive signals are produced from the ECL buffer circuit without the use of an intermediate gain stage thereby minimizing power consumption. Diode-connected transistors 58 and 64 function to shift the voltage level 0.6 volts, this establishing the magnitude of the difference voltage between the source of one of the P-type transistors and the gate of the other P-type transistor. Diode connected transistors 56 and 62 operate to adjust the maximum drive voltage applied to the sources of transistors 66 and 68 to be close to $V_{DD}$ so that the inverter circuit (transistors 74 and 76) powered by VDD will have the appropriate input signal swing. Depending upon other circuit parameters, it may be desirable to alter the amount of the level shift.

The cross-coupled translator circuit implementation of FIG. 3 can have certain speed limitations. Consider, for example, the conditions which exist when input Vin changes from the low state to the high state. Initially, transistors 68 and 70 will be on and transistors 66 and 72 will be off so that the output of the translator stage, the common drain connection of transistors 68 and 72, will be at a high voltage. When the inputs Vin and $\overline{V}$in change state, P-type transistor 66 will be quickly turned on and will act like a current source, the magnitude of the current being a function of the size of transistor 66 and the magnitude of gate-source drive signals. Transistor 68 will be rapidly switched off by the drive signals. However, the output of the translator circuit will remain high until transistor has been turned on.

Since the output is still high, the gate of transistor 70 connected to the output will be high so that transistor 70 will remain on and tend to sink all of the current provided by transistor 66 thereby reducing the amount of current needed to raise the gate of transistor 72 and turn the transistor on. Thus, unless transistor 66 is capable of providing a relatively large amount of current, there will be insufficient current to cause the translator stage output to change. One option would be to make the P-type transistor 66 and 68 very large relative to the N-type transistors 70 and 72. However, the large size transistors and the tendency of transistor 70 to sink current will reduce the operating speed of the circuit.

Figure 4:
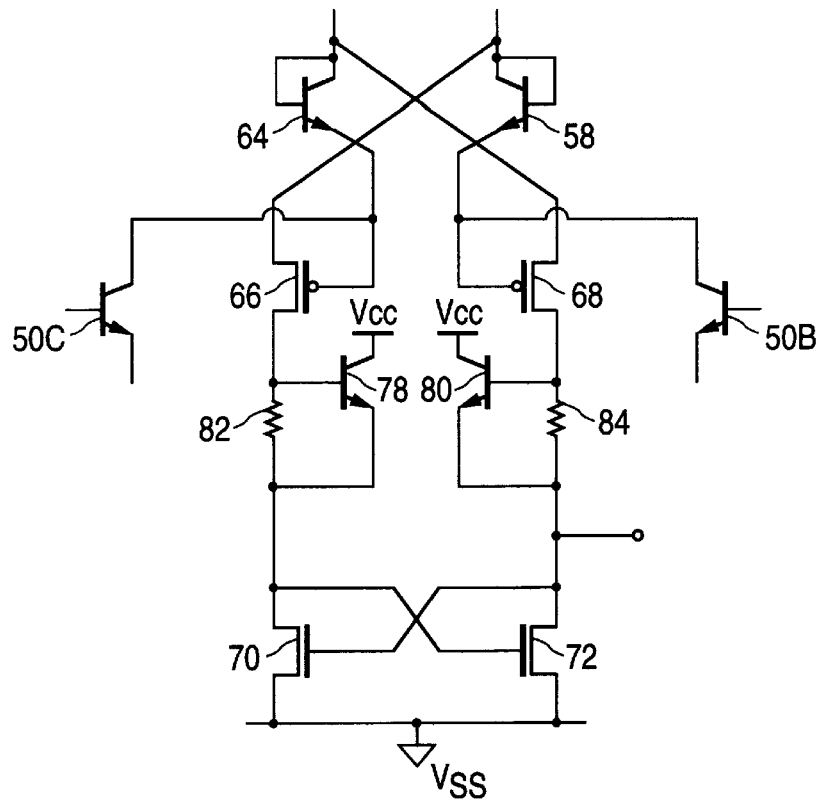
FIG. 4 is a schematic diagram of a modification to the FIG. 3 circuit.

FIG. 4 shows a modification of the FIG. 3 translator stage to address the potential switching problem. The same reference numerals used in FIG. 3 are used in FIG. 4 to designate similar circuit elements including the level shifting diode-connected transistors 58 and 64. A pair of NPN transistors 78 and 80 are added to the circuit to provide additional current drive when the stage is changing states. Resistor 82 is inserted in series with transistors 66 and 70 and resistor 84 is inserted in series with transistors 68 and 72. The P-type transistor drive signals shown in Table 1 above are also applied to transistors 66 and 68 of FIG. 4. When the stage output starts to change state as previously described, transistor 66 will proceed to source current through resistor 82. The voltage drop across the resistor will cause transistor 78 to turn on thereby adding to the current produced by transistor 66.

Once the state change has almost been completed, the voltage drop across resistor 82 is not sufficient to maintain transistor 78 in a conductive state so that the transistor is turned off. However, the current boost provided by transistor 78 is no longer needed at this point. Although the presence of resistor 82 does reduce the switching speed during the last small portion of the switchover, this current boost feature greatly increases the overall operating speed of the translator stage. Resistor 84 and transistor 80 provide a similar function when the translator stage output is changing from the low to the high state.

Figure 5:
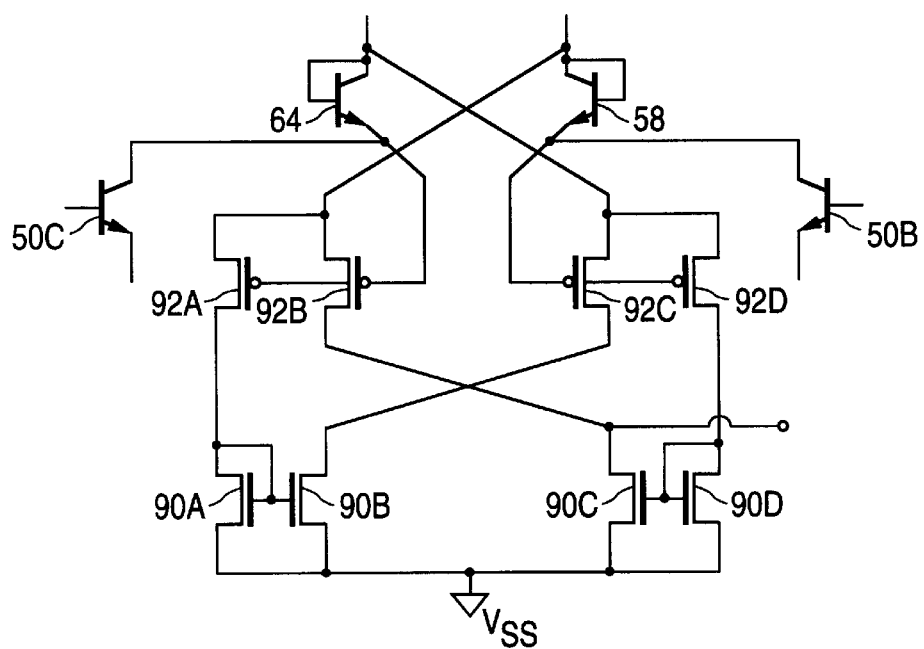
FIG. 5 is a schematic diagram of the translator stage of another embodiment of the invention.

FIG. 5 depicts a further embodiment of the translator stage using cross-coupled current mirrors. Again, the same reference numerals used in FIG. 3 are used in FIG. 5 to designate similar circuit elements including the level shifting diode-connected transistors 58 and 64. The current mirror embodiment may be preferred to those of FIGS. 3 and 4 in certain applications.

The circuit includes a pair of current mirror circuits, including a first mirror circuit which includes N-type transistors 90A and 90B and a second mirror circuit which includes N-type transistors 90C and 90D. The first current mirror is driven by an P-type transistor 92A having its source and gate connected in common with a second P-type transistor 92B. The second current mirror is driven by an P-type transistor 92D having its source and gate connected in common with a P-type transistor 92C. The output of the first current mirror circuit, the drain of transistor 90B, is connected to the drain of transistor 92C and the output of the second current mirror circuit, the drain of transistor 90C, is connected to the drain of transistor 92B.

The gate and source drive signals of Table 1 are the same drive signals which drive transistors 92A/92B and transistors 92C/92D. When the level shifting transistor 64 is raised in voltage and level shifting transistor 58 is lowered in voltage as a result of in a change in state of inputs Vin and $\overline{V}$in (FIG. 3), transistors 92C and 92D are turned on and transistors 92A and 92B are turned off. Conductive transistor 92D will drive the second current mirror causing the mirror output transistor 90C to turn on thereby tending to pull the translator stage output at the drain of transistor 90C down. When the inputs Vin and $\overline{V}$in change state, transistors 92A and 92B are turned on and transistors 92C and 92D are turned off. The second current mirror circuit will turn of so that transistor 90C is no longer conducive. Conductive transistor 92B will then be able to pull the translator circuit up to a high level. A further output buffer stage could be used as depicted in FIG. 3 for signal conditioning purposes.

Thus, a novel translating circuit has been disclosed suitable for converting, for example, ECL and other types of CML signals into CMOS signals. Although various embodiments of the invention have been described in some detail, it is to be understood that certain changes can be made by those skilled in the art without departing from the spirit and scope of the invention as defined by the appended claims.

I claim:

1. A level translating circuit having an input and an output comprising:

transistor drive circuitry operably connected to receive first and second differential input signals based upon an input signal applied to the translating circuit input, said transistor drive circuitry being configured to produce first, second, third and fourth drive signals, with each of the drive signals switchable between different voltage levels in response to changes in the first and second differential input signals; and a translator stage which includes first and second MOS transistors of a first conductivity type and third and fourth transistors, with a source and gate of the first transistor being connected to receive the first and second drive signals, respectively, and with a source and gate of the second transistor being connected to receive the third and fourth drive signals, respectively, and with a source and drain of the first transistor being connected in series with the third transistor and with a source and drain of the second transistor being connected in series with the fourth transistor and with the translating circuit output being formed intermediate the first and the third transistors.

2. The level translating circuit of claim 1 wherein the first and second MOS transistors are P-type transistors and wherein the first and second drive signals cause a voltage to be applied to the first transistor gate which is negative relative to the first transistor source when the first and second differential outputs are in a first state and wherein the third and fourth drive signals cause a voltage to be applied to the second transistor gate which is negative relative to the second transistor source when the first and second differential outputs are in a second state opposite the first state.

3. The level translating circuit of claim 2 further comprising a buffer circuit which produces the first and second differential input signals indicative of the translator circuit input signal and wherein the first and second drive signals cause a voltage to be applied to the gate of the first transistor which is positive relative to the source of the first transistor when the first and second differential outputs are in the second state and wherein the third and fourth drive signals cause a voltage to be applied to the gate of the second transistor which is positive with respect to the second transistor source when the first and second differential outputs are in the first state.

4. The level translating circuit of claim 3 wherein the third and fourth transistors are N-type MOS transistors, with a source and drain of the third transistor connected in series with the source and drain of the first transistor and with a source and drain of the fourth transistor connected in series with the source and drain of the second transistor.

5. The level translating circuit of claim 4 wherein a gate of the third transistor is connected to the drain of the fourth transistor and a gate of the fourth transistor is connected to the drain of the third transistor.

6. The level translating circuit of claim 4 wherein the translator stage includes first and second current mirror circuits and wherein the third transistor forms an output half of the first current mirror circuit and wherein the fourth transistor forms an output half of the second current mirror circuit.

7. The level translating circuit of claim 6 wherein the first current mirror includes a fifth N-type MOS transistor having a gate and source connected to the gate and source, respectively, of the third transistor so as to form an input half of the first current mirror circuit and a sixth N-type MOS transistor having a gate and source connected to the gate and source, respectively, of the fourth transistor so as to form an input half of the second current mirror circuit.

8. The level translating circuit of claim 4 wherein the voltage levels of the first drive signal are the same as the voltage levels of the third drive signal and the voltage levels of the fourth drive signal are different from the voltage levels of the first and third drive signals and the same as the second drive signal.

9. A level translating circuit having an input and an output, said level translating circuit comprising:

a buffer circuit which produces a buffered output switchable between first and second states in response to changes in the translating circuit input;

transistor drive circuitry configured to produce first, second, third and fourth drive signals, with each of the drive signals switchable to one voltage level when the buffered output is in the first state and to another voltage level, different than the one voltage level, when the buffered output is in the second state; and a translator stage which includes first and second MOS transistors of a first conductivity type and third and fourth MOS transistors of a second conductivity type opposite the first conductivity type, with a source and gate of the first transistor being connected to receive the first and second drive signals, respectively, and with a source and gate of the second transistor being connected to receive the third and fourth drive signals, respectively, and with a source and drain of the first transistor being connected in series with a source and drain of the third transistor and with a source and drain of the second transistor being connected in series with a source and drain of the fourth transistor and with the translating circuit output being formed intermediate the first and the third transistors.

10. The level translating circuit of claim 9 wherein the buffer circuit produces first and second differential outputs and wherein the transistor drive circuitry includes a first segment connected to the first differential output and a second segment connected to the second differential output, with the first segment operating to produce the first and fourth drive signals and with the second segment operating to produce the second and third drive signals.

11. The level translating circuit of claim 10 wherein the first and second segments each include a bipolar transistor configured as an emitter follower and a diode-connected bipolar transistor connected in series with an output of the emitter follower.

12. The level translating circuit of claim 11 wherein the fourth drive signal is produced at a location on the first segment intermediate the emitter follower output and a first terminal of the diode-connected transistor and the first drive signal is produced at a location on the first segment at a second terminal of the diode-connected terminal and wherein the second drive signal is produced at a location on the second segment intermediate the emitter follower output and a first terminal of the diode-connected transistor and the third drive signal is produced at a location on the second segment at a second terminal of the diode-connected transistor.

13. The level translating circuit of claim 12 wherein the first and second segments terminate in separate current sources.

14. The level translating circuit of claim 10 wherein the first and second differential outputs each have a voltage swing when the buffer circuit changes state and wherein a difference between the one and the another voltage level of the first, second, third and fourth drive signals is approximately equal to a magnitude of the voltage swing.

15. A level translating circuit having an input in the form of first and second differential input signals which change between first and second voltage levels and an output, said level translating circuit comprising:

transistor drive circuitry configured to produce, in response to the first and second differential input signals, first, second, third and fourth drive signals, each of which is switchable between different voltage levels, with a difference between the different voltage levels being approximately equal in magnitude to a difference between the first and second voltage levels;

a translator stage which includes first and second MOS transistors of a first conductivity type and third and fourth transistors, with a source and gate of the first transistor being connected to receive the first and second drive signals, respectively, and with a source and gate of the second transistor being connected to receive the third and fourth drive signals, respectively, and with a source and drain of the first transistor being connected in series with the third transistor and with a source and drain of the second transistor being connected in series with the fourth transistor and with the translating circuit output being formed intermediate the first and the third transistors.

16. The level translating circuit of claim 15 wherein the first and second MOS transistors are P-type transistors and wherein the first and second drive signals cause a voltage to be applied to the first transistor gate which is negative relative to the first transistor source when the first and second differential outputs are in a first state and wherein the third and fourth drive signals cause a voltage to be applied to the second transistor gate which is negative relative to the second transistor source when the first and second differential outputs are in a second state opposite the first state.

17. The level translating circuit of claim 16 wherein the first and second drive signals cause a voltage to be applied to the gate of the first transistor which is positive relative to the source of the first transistor when the first and second differential outputs are in the second state and wherein the third and fourth drive signals cause a voltage to be applied to the gate of the second transistor which is positive with respect to the second transistor source when the first and second differential outputs are in the first state.

18. The level translating circuit of claim 17 wherein the third and fourth transistors are N-type MOS transistors, with a source and drain of the third transistor connected in series with the source and drain of the first transistor and with a source and drain of the fourth transistor connected in series with the source and drain of the second transistor.

19. The level translating circuit of claim 18 wherein a gate of the third transistor is connected to the drain of the fourth transistor and a gate of the fourth transistor is connected to the drain of the third transistor.

20. The level translating circuit of claim 18 wherein the translator stage includes first and second current mirror circuits and wherein the third transistor forms an output half of the first current mirror circuit and wherein fourth transistor forms an output half of the second current mirror circuit.

21. The level translating circuit of claim 20 wherein the first current mirror includes a fifth N-type MOS transistor having a gate and source connected to the gate and source, respectively, of the third transistor so as to form an input half of the first current mirror circuit and a sixth N-type MOS transistor having a gate and source connected to the gate and source, respectively, of the fourth transistor so as to form an input half of the second current mirror circuit.

22. A method of translating first and second input signals which vary in a first voltage range and have a voltage swing of a first magnitude to a digital output signal which varies in a second voltage range, different from the first voltage range, said method comprising the following:

shifting the first differential input signal by a first voltage quantity so as to produce a first drive signal with a voltage swing magnitude equal to the first magnitude;

shifting the first differential input signal by a second voltage quantity, different than the first voltage quantity, so as to produce a second drive signal with a voltage swing magnitude equal to the first magnitude;

shifting the second differential input signal by a third voltage quantity so as to produce a third drive signal with a voltage swing equal to the first magnitude;

shifting the second differential input signal by a fourth voltage quantity, different than the third voltage quantity, so as to produce a fourth drive signal with a voltage swing equal to the first magnitude;

providing a translator stage which includes first and second transistors connected in series and third and fourth transistors connected in series;

applying the first drive signal to a gate of the third transistor;

applying the second drive signal to a source of the first transistor;

applying the third drive signal to a gate of the first transistor;

applying the fourth drive signal to a source of the third transistor; and producing the digital output signal at a location on the translator stage intermediate the first and second transistors.

23. The method of claim 22 wherein the first and third transistors are P-type MOS transistors and wherein the second voltage quantity is greater than the first voltage quantity and the fourth voltage quantity is greater than the third voltage quantity.

24. The method of claim 23 wherein the first and third voltage quantities are equal and the second and fourth voltage quantities are equal.

25. The method of claim 24 wherein the shifting of the first differential input signal by a first voltage quantity and the shifting of the first differential input signal of a second voltage quantity include the step of providing a first emitter follower circuit having an input which receives the first differential input signal and a base-emitter voltage drop of the first emitter follower circuit contributes to the first and second voltage quantities and wherein the shifting of the second differential input signal by a third voltage quantity and the shifting of the second differential input signal of a fourth voltage quantity include the step of providing a second emitter follower circuit having an input which receives the second differential input signal and a base-emitter voltage drop of the second emitter follower circuit contributes to the third and fourth voltage quantities.

26. The method of claim 25 wherein the shifting of the first differential input signal by a second voltage quantity further includes the step of providing a first diode-connected transistor connected in series with an output of the first emitter follower circuit, with the difference between the first and second voltage quantities being equal to a voltage drop produced by the first diode-connected transistor and wherein the shifting of the second differential input signal by a third voltage quantity further includes the step of providing a second diode-connected transistor connected in series with an output of the second emitter follower circuit, with the difference between the third and fourth voltage quantities being equal to a voltage drop produced by the second diode-connected transistor.

27. A level translating circuit having an input and an output, said level translating circuit comprising:
a buffer circuit which produces first and second differential outputs which are indicative the translating circuit input;
transistor drive circuitry configured to produce first, second, third and fourth drive signals, with each of the drive signals switchable between different voltage levels in response to changes in the first and second differential outputs; and
a translator stage which includes first and second MOS transistors of a first conductivity type and third and fourth transistors, with a source and gate of the first transistor being connected to receive the first and second drive signals, respectively, and with a source and gate of the second transistor being connected to receive the third and fourth drive signals, respectively, and with a source and drain of the first transistor being connected in series with the third transistor and with a source and drain of the second transistor being connected in series with the fourth transistor and with the translating circuit output being formed intermediate the first and the third transistors.

28. The level translating circuit of claim 27 wherein the first and second MOS transistors are P-type transistors and wherein the first and second drive signals cause a voltage to be applied to the first transistor gate which is negative relative to the first transistor source when the first and second differential outputs are in a first state and wherein the third and fourth drive signals cause a voltage to be applied to the second transistor gate which is negative relative to the second transistor source when the first and second differential outputs are in a second state opposite the first state.

29. The level translating circuit of claim 28 wherein the first and second drive signals cause a voltage to be applied to the gate of the first transistor which is positive relative to the source of the first transistor when the first and second differential outputs are in the second state and wherein the third and fourth drive signals cause a voltage to be applied to the gate of the second transistor which is positive with respect to the second transistor source when the first and second differential outputs are in the first state.

30. The level translating circuit of claim 29 wherein the third and fourth transistors are N-type MOS transistors, with a source and drain of the third transistor connected in series with the source and drain of the first transistor and with a source and drain of the fourth transistor connected in series with the source and drain of the second transistor.

31. The level translating circuit of claim 30 wherein a gate of the third transistor is connected to the drain of the fourth transistor and a gate of the fourth transistor is connected to the drain of the third transistor.

32. The level translating circuit of claim 30 wherein the translator stage includes first and second current mirror circuits and wherein the third transistor forms an output half of the first current mirror circuit and wherein fourth transistor forms an output half of the second current mirror circuit.

33. The level translating circuit of claim 32 wherein the first current mirror includes a fifth N-type MOS transistor having a gate and source connected to the gate and source, respectively, of the third transistor so as to form an input half of the first current mirror circuit and a sixth N-type MOS transistor having a gate and source connected to the gate and source, respectively, of the fourth transistor so as to form an output half of the second current mirror circuit.

34. The level translating circuit of claim 30 wherein the voltage levels of the first drive signal are the same as the voltage levels of the third drive signal and the voltage levels of the fourth drive signal are different from the voltage levels of the first and third drive signals and the same as the second drive signal.

35. A method of translating a digital input signal at a first voltage level which varies in a first voltage range to a digital output signal at a second level, different from the first voltage level, which varies in a second voltage range which differs from the first voltage range, said method comprising the following:
producing first and second buffered differential signals using the digital input signal, with the differential signals having a voltage swing of a first magnitude;
shifting the first buffered differential signal by a first voltage quantity so as to produce a first drive signal with a voltage swing magnitude equal to the first magnitude;
shifting the first buffered differential signal by a second voltage quantity, different than the first voltage quantity, so as to produce a second drive signal with a voltage swing magnitude equal to the first magnitude;
shifting the second buffered differential signal by a third voltage quantity so as to produce a third drive signal with a voltage swing equal to the first magnitude;
shifting the second buffered differential signal by a fourth voltage quantity, different than the third voltage quantity, so as to produce a fourth drive signal with a voltage swing equal to the first magnitude;

providing a translator stage which includes first and second transistors connected in series and third and fourth transistors connected in series;

applying the first drive signal to a gate of the third transistor;

applying the second drive signal to a source of the first transistor;

applying the third drive signal to a gate of the first transistor;

applying the fourth drive signal to a source of the third transistor; and producing the digital output signal at a location on the translator stage intermediate the first and second transistors.

36. The method of claim 35 wherein the first and third transistors are P-type MOS transistors and wherein the second voltage quantity is greater than the first voltage quantity and the fourth voltage quantity is greater than the third voltage quantity.

37. The method of claim 36 wherein the first and third voltage quantities are equal and the second and fourth voltage quantities are equal.

38. The method of claim 37 wherein the shifting of the first buffered differential signal by a first voltage quantity and the shifting of the first buffered signal of a second voltage quantity include the step of providing a first emitter follower circuit having an input which receives the first buffered differential signal and a base-emitter voltage drop of the first emitter follower circuit contributes to the first and second voltage quantities and wherein the shifting of the second buffered differential signal by a third voltage quantity and the shifting of the second buffered signal of a fourth voltage quantity include the step of providing a second emitter follower circuit having an input which receives the second buffered differential signal and a base-emitter voltage drop of the second emitter follower circuit contributes to the third and fourth voltage quantities.

39. The method of claim 38 wherein the shifting of the first buffered differential signal by a second voltage quantity further includes the step of providing a first diode-connected transistor connected in series with an output of the first emitter follower circuit, with the difference between the first and second voltage quantities being equal to a voltage drop produced by the first diode-connected transistor and wherein the shifting of the second buffered differential signal by a third voltage quantity further includes the step of providing a second diode-connected transistor connected in series with an output of the second emitter follower circuit, with the difference between the third and fourth voltage quantities being equal to a voltage drop produced by the second diode-connected transistor.

* * * * *